United States Patent [19]

Wenham et al.

[11] Patent Number: 4,726,850
[45] Date of Patent: Feb. 23, 1988

[54] BURIED CONTACT SOLAR CELL

[75] Inventors: Stuart R. Wenham, Bexley, North; Martin A. Green, Waverley, both of Australia

[73] Assignee: Unisearch Limited, Kensington, Australia

[21] Appl. No.: 35,194

[22] Filed: Apr. 7, 1987

Related U.S. Application Data

[63] Continuation of Ser. No. 716,115, Mar. 26, 1985, abandoned.

[30] Foreign Application Priority Data

Mar. 26, 1984 [AU] Australia ............................. PG4244

[51] Int. Cl.$^4$ ............................................. H01L 31/06
[52] U.S. Cl. ....................................... 136/256; 357/30; 357/55; 357/68
[58] Field of Search ........................................ 136/256

[56] References Cited

U.S. PATENT DOCUMENTS

| | | | |
|---|---|---|---|
| 3,278,337 | 10/1966 | Gault | 136/255 |
| 3,331,707 | 7/1967 | Werth | 136/253 |
| 4,321,283 | 3/1982 | Patel et al. | 427/74 |
| 4,336,281 | 6/1982 | Van Mourik | 427/74 |
| 4,352,948 | 10/1982 | Kaplow et al. | 136/249 |
| 4,355,196 | 10/1982 | Chai | 136/259 |
| 4,401,840 | 8/1983 | Chitre | 136/258 |
| 4,409,423 | 10/1983 | Holt | 136/255 |

*Primary Examiner*—Aaron Weisstuch
*Attorney, Agent, or Firm*—Christie, Parker & Hale

[57] ABSTRACT

An electrical contact formed in a groove in the surface of a semiconductor material facilitates an advantageous contact with the material for a given cross-sectional area of contact when compared with a contact of the same cross-sectional area formed on the surface of the material. The grooved contact significantly reduces shading of the surface of the semiconductor material compared with an equivalent surface contact.

5 Claims, 4 Drawing Figures

4,726,850

BURIED CONTACT SOLAR CELL

CROSS-REFERENCE TO RELATED APPLICATIONS

This is a continuation of application Ser. No. 716,115 filed Mar. 26, 1985, now abandoned.

FIELD OF THE INVENTION

The present invention relates to electrical contacts and more particularly to electrical contacts formed on a substrate, e.g., a solar cell.

The invention will be described with particular reference to solar cells but it will be appreciated that it is not limited to such an application.

BACKGROUND OF THE INVENTION

Conventional screen printed solar cells have their main advantages lying with their simplicity of fabrication and the associated low production costs. However, there are numerous disadvantages. Screen printed contacts typically have a minimum metallisation width of about 150 $\mu$m. The consequence is a fairly high degree of shading of the top surface of the solar cell, often in the vicinity of 12%. In addition, the high shading losses require a minimum spacing between fingers usually of at least 3 mm. This results in the silicon surface requiring very heavy doping to give sufficiently good conductivity in the diffused layer so as to reduce the lateral resistance losses to respectable values. The unfortunate consequence of the heavy doping is a poor response of the solar cell to short wavelength light. This is because the high energy photons generate electron-hole pairs near the surface in the heavily doped region which recombine without contributing to the generated current. Another problem area for screen printed contacts is the associated high contact resistance that is established between the metallisation and the silicon surface. Optimisation of infra-red furnace firing conditions or subsequent immersion in hydrofluoric acid can reduce this problem although neither will totally eliminate it. Finally, any solar cell with the diffused layer confined to the top surface will suffer from a poor response to long wavelength light unless it has extremely long bulk minority carrier lifetimes. Solar cells fabricated on polycrystalline substrates are a good example of such solar cells as they typically will possess bulk minority carrier lifetimes of only about 70 $\mu$m for a 1 ohm centimeter resistivity.

SUMMARY OF THE INVENTION

The present invention proposes a buried contact through applying the metal to an already formed groove which results in numerous advantages over conventional contacts, which include:

(1) Grooves can be made to have their depth considerably greater than their width. This is the opposite to conventional contacts whose width is usually substantially greater than their depth. For instance, a standard screen printed contact will typically be 150 $\mu$m wide and 20 $\mu$m deep. In comparison, a groove filled contact of the same metal can be 30 $\mu$m wide and 100 $\mu$m deep, giving the same cross sectional area for current handling but with only one fifth the shading loss. This factor alone gives a solar cell having buried contacts in accordance with the present invention an increase in output power of about 8%.

(2) For a given width groove, there remains considerable flexibility as to the depth, particularly if a laser scriber is being used. Consequently, for the example in (1) above, the 30 $\mu$m wide groove could just as easily be made 150 $\mu$m or 200 $\mu$m deep in which case the series resistance of the metal contact is also greatly reduced from that of a conventional contact without altering the shading losses. This gives an improvement in fill factor which translates to a further 1-2% boost in output power over the conventional solar cell.

(3) The large area of contact between the metal in the groove and the silicon reduces the contact resistance. This improvement however, is only small as contact resistance in conventional cells is rarely a significant factor.

(4) Another significant advantage of a solar cell having electrical contacts according to this invention is that it facilitates closely spaced fingers. In contrast, screen printed contacts typically have a minimum finger (metallisation) width of about 150 $\mu$m. This consequently requires a minimum spacing between fingers to be in the vicinity of 3-4 mm to prevent excessive shading of the solar cell surface. However, such widely spaced fingers require that the silicon surface be very heavily doped to increase its conductivity and hence reduce the lateral resistance for the generated charge carriers travelling in the diffused impurity layer. The unfortunate consequence of the heavy doping is a poor response of the solar cell to short wavelength light. This is because the high energy photons generate electron-hole pairs near the surface in the heavily doped region, which recombine without contributing to the generated current. These problems are overcome with a solar cell having contacts according to the present invention, as closely spaced fingers can be used without excessive shading, thereby facilitating a lightly doped silicon surface, thus providing a solar cell with good response to short wavelength light. The output power boost through this alone, over a conventional screen printed solar cell, is in the range of 5-10%. The net electrical output current boost resulting from (1)-(4) is in the range 15-20%.

(5) The formation of buried contacts may be through the application of a metal paste via a squeegee, greatly simplifying the method for forming the metallisation. It removes the necessity for expensive vacuum evaporation equipment or equivalent and removes any alignment requirements when screen printing. The requirement, however, exists for forming the grooves which can be done in numerous ways, the simplest probably being with a laser scriber which can simultaneously be done while carrying out an edge junction isolation step around the perimeter of the solar cell.

(6) A further electrical boost is obtained through having a buried contact, through its enhanced response to long wavelength light. Unlike high energy photons, many of the low energy photons are absorbed deep in the substrate, thus generating electron hole pairs that are a long way from the rectifying P-N junction. However, the buried contact in the groove provides a P-N junction that is able to collect some of the generated charge carriers that would otherwise be lost by a cell with junction only at the cell surface.

(7) A particular area where a solar cell having buried contacts according to the present invention may have advantage is as a concentrator cell where the metallisation must be capable of carrying much greater currents but without excessive shading.

According to the present invention there is provided a method of forming an electrical contact on a substrate, comprising forming a groove in the surface of the substrate and applying an electrically conducting material to fill the groove and form a contact.

In another aspect the present invention provides a substrate having an electrically conducting contact formed by the method aforesaid.

BRIEF DESCRIPTION OF THE DRAWINGS

The present invention will now be described by way of example with reference to the accompanying drawings, in which.

DETAILED DESCRIPTION

Figure 1:
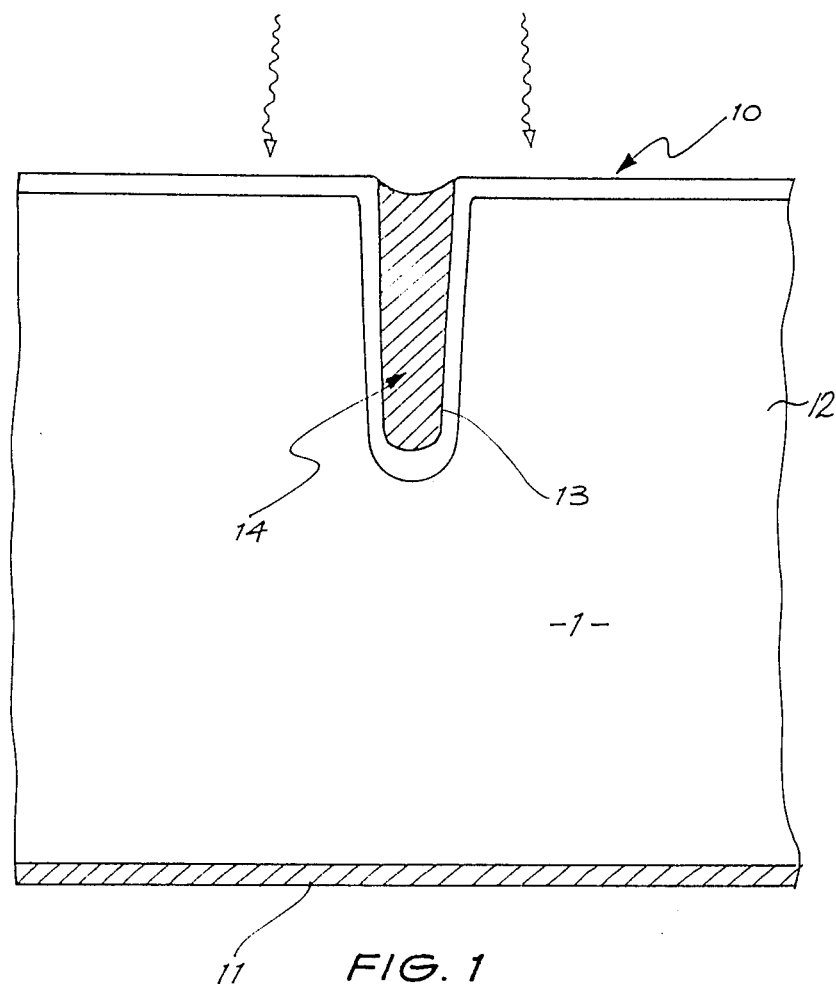
FIG. 1 is a schematic cross-sectional view of a portion of a solar cell incorporating a buried contact in accordance with the invention.

In FIG. 1 there is shown a section of a solar cell 1 having a top surface 10 formed of n-type material, a rear metal contact 11 and a cell body 12 of p-type material. A groove 13 formed in top surface 10 contains a metallised contact 14.

The solar cell 1 has a plurality of grooves 13 in the wafer surface to define the contact metallisation. The grooves 13 may be formed by laser scribing, chemically etching, or mechanical abrasion. The metallisation can be applied in paste form by a sweeping stroke of a squeegee or equivalent, across the wafer surface, forcing the metal paste into the grooves 13. The metal can also be filled into the grooves by various alternative means including solder dipping and electroplating. These latter techniques may first require the application of a thin layer of metal such as titanium, to the bottom of each groove 13 by such as vacuum evaporation or equivalent. Any of the above may be carried out in conjunction with appropriate photo lithographic work for defining grooves or for metal definition.

Formation of grooved contacts is particularly suited to polycrystalline substrates where the different grain orientations provide strength in the grooved regions. Grooves, however, can also be used in single crystal substrates but may require shallow grooves (i.e., only to 100 $\mu$m depth) or else greater handling care during processing, and/or thicker substances (i.e., 600 $\mu$m thick). Typically the width of a groove relative to its depth is in the range 1:2 to 1:7.

Various parameters to be considered in designing a buried contact solar cell in accordance with the invention include:

(i) Sheet resistivity $P_s$ is desirably 60$\Omega$/□ as the response of the resultant cell to short wavelength light deteriorates rapidly below this value.

(ii) Groove width $W_g$ is preferably >25 $\mu$m to ensure spin-on diffusion source adequately coats the groove walls. Simultaneously, $W_g$ must not be too wide (e.g. <100 $\mu$m) as shading losses become excessive.

(iii) Groove depth $t_g$ is preferably not greater than half the width of the wafer as too much weakening of the substrate results. Preferably, $t_g > 5000/W_g$ for $t_g$ and $W_g$ in $\mu$m for screen printed silver paste or $t_g > 1700/W_g$ for $t_g$ and $W_g$ in $\mu$m for plated silver, as this provides adequate cross sectional area for the silver conductor.

(iv) Finger spacing should preferably be in the range of 1.5–2.5 $\mu$m depending upon the $P_s$ and the shading losses created by $W_g$.

(v) Tapering of fingers and busbars is desirable so as to keep the current density within the silver below 1000A/cm$^2$ (for screen printed silver).

An embodiment of the present invention utilises a finger spacing of 1.8 mm, a finger width of 45–50 $\mu$m and a finger depth of 100–150 $\mu$m. The resulting shading losses are 3.5–4.0% and the necessary sheet resistivity is about 80$\Omega$/□. The corresponding power loss in the top diffused layer is of the order to 2%. Assuming the grooves are full of silver paste, the cross sectional area of the fingers is about 6000 sq.$\mu$m thus allowing a 10 cm length of finger to be utilised without exceeding the specified current density.

One example of a processing sequence suitable for producing a buried contact solar cell in accordance with the present invention is:

SEQUENCE A (i) Scribing of grooves
(ii) Sodium hydroxide etch followed by HCl clean
(iii) Thorough D.I. rinse and dry
(iv) Spin-on phosphorus diffusion source
(v) Diffuse
(vi) Back contact application and fire
(vii) Hydrofluoric acid removal of oxidised spin-on source
(viii) Thorough D.I. rinse and dry
(ix) Application of silver paste and fire
(x) Edge isolation
(xi) Antireflection coating application
(xii) Electrically test To be included in the processing sequence is plasma etching which will be done simultaneously with the antireflection coating. Its position in the processing sequence may be as in Sequence A or alternatively may be inserted either before the back contact application or else before the application of the silver paste.

Another sequence, which may yield a higher efficiency is that of Sequence B which includes an additional diffusion step and high quality oxide growth.

SEQUENCE B (i) Etch away saw damage as necessary
(ii) Spin-on and diffuse
(iii) Chemical clean with H.F.
(iv) High quality oxide growth
(v) Silicon nitride A.R. coating
(vi) Laser grooves
(vii) Sodium hydroxide etch out of grooves
(viii) Spin-on and diffusion of grooves
(ix) Back contact and fire
(x) Front contact and fire
(xi) Edge isolation
(xii) Electrically test

PROCESSING DETAILS FOR SEQUENCE A (i) Scribing of Grooves

The shape of the cut made by the laser into the silicon is not very important as the groove is most effectively shaped through the subsequent sodium hydroxide etch. However, there are a few preferred specifications the laser must meet: firstly, the width of the groove needs to be less than 35 $\mu$m, preferably only about 25 $\mu$m; secondly, the power of the laser needs to be consistent so as to provide reasonable uniformity to the groove depth; thirdly, the laser power needs to be sufficient to scribe a cut of at least 100 μm depth into silicon with preferably an option of being able to cut down to about 200 μm; fourthly, the speed of the laser needs to be adequate for production quantities; and finally, the laser Q switch and shutter need to be software controllable. The latter of these is necessary because of the finite time taken for the mechanical shutter to open. To commence each scribe, the shutter needs to be already open with the beam turned off via the Q switch so that the beam can then be virtually instantly turned on when the X-Y table begins to move. If these are not synchronised in this manner then either the wafer will move before the beam commences or else even worse, the beam will commence while the wafer is stationary and hence drill a hole right through the wafer.

(ii) Sodium hydroxide etching of grooves

Figure 2C:
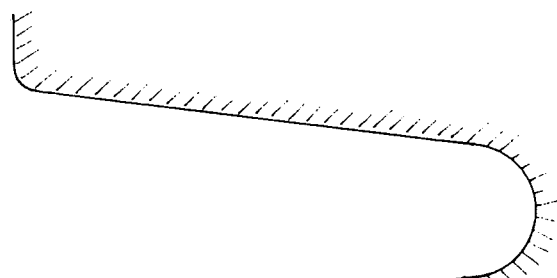
FIGS. 2(a), (b) and (c) are profile shapes for three different grooves for receiving "buried" contacts in accordance with the present invention.
Figure 2B:
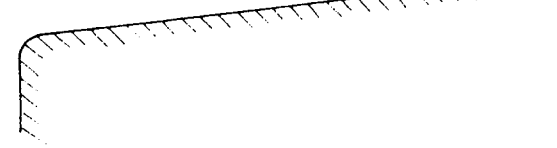
Figure 2A:
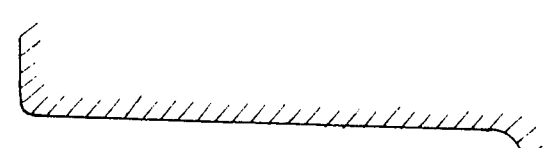

Hot sodium hydroxide will simultaneously clean out and shape the grooves and remove saw damage from the wafer surface. These etching conditions can however be fairly important if a particular groove shape is required. For instance, if a "V" shaped groove as indicated in FIG. 2(a) is required, then a low sodium hydroxide concentration (about 2%) should be used at moderately high temperatures (90°-95° C.) This allows depletion of the solution to take place deep in the groove and, in addition, the relatively high reaction rate caused by the high temperature creates much greater turbulence (and hence replenishment of the solution) near the surface, thus resulting in greater etch rates towards the top surface. The net result is very little etching at the bottom of the groove and progressively more etching towards the top of the groove thus giving gently sloping sides in a "V" formation. The other extreme is shown in FIG. 2(b) with the "U" shaped groove. The steep walls are obtained via a high concentration (about 30%) sodium hydroxide solution at fairly low temperatures (65°-70° C.).

The consequence of these conditions is that the solution no longer depletes in the bottom of the groove and so the etching proceeds at a fairly uniform rate independent of depth within the groove. Optimistically, the latter is the desired shape from the viewpoint that for a given degree of top surface shading, the greatest cross-sectional area of groove is obtained. However, complications associated with coating such steep groove walls with the spin-on diffusion source may require a compromise as indicated by FIG. 2(c). By using a high concentration sodium hydroxide solution at a high temperature (95°-110° C.), considerable etching and hence widening of the groove takes place at the bottom, although still more so approaching the top surface. Time is of course another important variable with all etching conditions as it determines the overall groove width obtained.

Finally, regarding the etching of the grooves, the depth is solely determined by the laser as the sodium hydroxide tends not to etch away silicon in the downwards direction from the top surface.

(iii) Cleaning and D.I. rinsing

All cleaning of grooved wafers in chemical solutions or D.I. water needs to be done a little more thoroughly than would be required for a flat suface wafer. This is the case because of the necessity for the solutions to thoroughly clean out the grooves. For instance, if 5 minutes rinsing in D.I. water was necessary for a flat surface wafer then probably 7 minutes would be required for a grooved wafer.

(iv) Spin-on phosphorus diffusion source

The coating of the grooved wafer with a phosphorus source can be effectively done on a spinner in a manner similar to non grooved wafers. One variation however, is that the grooves need to be filled before the spinning is actually commenced. This is achieved by delaying 2-3 seconds after application of a few drips of spin-on source prior to spinning. This allows the grooves to fill by capillary action as the material literally shoots along them. Failure to incorporate this delay will result in the spin-on source being spun over the top of the grooves with very little finding its way into the grooves.

(v) Drying and diffusion of wafers

This is carried out in a manner identical to flat surface solar cells. However, it is important that all material in the grooves be dry prior to diffusion. If after inspection this is found not to be the case, then the drying temperature or time should be increased accordingly.

To roughly check the diffusion in the groove, repeated four point probe measurements could be made parallel to a groove at different distances from it. If the readings near the grooves are substantially higher than those further away then the groove diffusion is too light. At the other extreme if the readings closest to the groove substantially drop then it indicates heavier diffusion in the groove than elsewhere which should be quite acceptable and perhaps beneficial. Finally, if the values close to the grooves don't substantially change, then the diffusion in the grooves is probably comparable to that elsewhere on the surface, which should also be acceptable.

(vi) Back contact application and firing

This technology is suited to almost any type of back metallic contact, whether screen printed, vacuum evaporated, plated, or other. There should be no adverse effects through the presence of the grooves.

(vii) Hydrofluoric acid removal of oxidised spin-on source

By dipping the wafers in 10% hydrofluoric acid, the oxidised spin-on source should be removed in under 30 seconds. If, however, after 30 seconds some material is still evident in the grooves, it is because that remaining material was not fully oxidised in the diffusion furnace. Initially this could well be the case since the diffusion source will probably be thicker in the grooves and hence more difficult to oxidise. The possible remedies include: raising the temperature that the wafers are exposed to in the oxidising region of the diffusion furnace (i.e. this should have little if any effect on the sheet resistivity); increasing the time that the wafers spend in the oxidising part of the diffusion furnace; increasing the spin speed of the spin coater to give a thinner layer everywhere; or else further diluting the spin-on source with isopropanol so less material will be left to require oxidation. Each possibility requires evaluation in terms of its success at solving the above problem (if it occurs) as well as with regard to any side effects the particular change causes. (viii) as per (iii)

(ix) Application of silver paste and subsequent firing

It is not a difficult task to adequately fill the grooves with silver paste by the stroke of a rubber squeegee directly across the wafer surface. However, what could prove to be far more difficult is the task of preventing the remainder of the silver paste from making a mess on the base plate and the surrounds. It is probably necessary for the rubber squeegee to be in direct contact with the silicon surface and hence the problem remains to prevent the paste being pushed over the edge of the wafer.

For this step to be carried out most effectively, the rubber squeegee needs to always be in quite good condition and be mounted in a perfectly flat manner. If this is not the case, streaks of unwanted silver paste are likely to be left across the surface. Similarly, if in step (ii) the wafers are over-etched and it is polysilicon material, then vertical steps will result at the grain boundaries, resulting in them being coated with silver paste in this current step. This latter case can be easily checked under the microscope.

Another potential problem in this step could be the "blowing out" of some regions of the paste during firing. There are two possible causes of this effect. Firstly, if the drying temperature is too high, the rapid evolution of evaporated solvents from the pastes can lead to sufficient forces on the paste to force it out of the grooves. This being the case, the drying temperature should be reduced. It is anticipated that drying temperatures in the range of 150°-300° C. are quite suitable. Secondly, if the paste is not adequately dried when the wafer passes into the high temperature section similar results can occur for the same reasons. This time, however, the drying temperature or time needs to be increased.

(x) Edge isolation

In the laboratory all edge isolations are carried out by scribing the rear of the solar cell and then cleaving off the edges. This gives superior results to a front surface laser scribed edge junction isolation and is essential for prototype small area cells which have been made. For larger cells however, leakage around the edge is not as important, thus making a front surface scribe suitable.

Another alternative is to scribe a groove (200-300 μm) right around the wafer edge at the same time as the grooves are put in for the metal. The edge bits will then require cleaving at the end and will need to be done with considerable care because they become somewhat more difficult to snap after the scribe has been cleaned out with the sodium hydroxide etch.

Finally, plasma etched edge isolation can be carried out by coin stacking the solar cells in the plasma system. This is the technique believed to be used very effectively by several commercial enterprises.

(xi) Antireflection coating

This can be done in the plasma system in the presence of ammonia gas and silane. This will deposit silicon nitride which is an excellent material for antireflection coatings. The thickness needs to be in the vicinity of 700Å, which should give a deep blue, bordering on purple color when deposited on polished silicon. Optimisation of this thickness cannot be carried out on textured wafers as from such a surface there will effectively be no reflection.

Silicon nitride is extremely resistant to chemical and mechanical attack, thus giving it many beneficial characteristics. It does, however, pose a difficulty for subsequent soldering as the metal if not masked will also be coated. This problem may of course be alleviated if one of the alternative sequences is adopted.

(xii) Electrical testing

It is of benefit to test cells under a xenon arc lamp or equivalent that has a reasonable output at the blue end of the spectrum. Unfortunately, ELH lamps lack this, thus resulting in them failing to fully exploit the improved blue response of the buried contact solar cell. The resulting current measured will thus be relatively lower than it should be compared to that of a heavily diffused solar cell (i.e. a conventional screen printed solar cell). This problem, however, is not of great importance when one buried contact solar cell is being measured relative to another. This means that calibration of buried contact solar cell standards should be done under a xenon arc lamp or equivalent but that ELH lamps would be suitable for routine monitoring of cells produced to the same specifications.

PLATING SEQUENCE

A modification to "Sequence B" above could be used to allow the metal contacts to the cell to be applied by electrolytic or electroless plating. Steps (i) to (viii) would be as described. After diffusion and removal of diffusion oxide, nickel would be electrolessly plated to the cell in regions not covered by the silicon nitride antireflection coating. Sensitizing prior to nickel plating by a suitable electroless solution may give best results. After sintering of the nickel layer, a conducting layer, probably copper, could be plated to the nickel to a thickness consistent with producing low resistance. Without the grooves, this would cause considerable broadening out of the top metallisation lines. The grooves, however, would confine the plated metal to the volume within the groove until it was completely filled with plated material. The copper layer could be covered by a thin electrolessly plated layer of another metal if its reactivity with cell encapsulating material was a concern. Edge junction isolation could be achieved with any of the standard methods.

Alternatively, after nickel plating the cell may be solder dipped. The solder would attach itself preferentially to the plated regions. The grooves then determine the lateral geometry of the solder layer.

We claim:

1. A solar cell comprising a body of semiconductor material with electrical contacts formed by conducting material arranged in a pattern in one or more grooves formed in the light incident surface of said semiconductor material, wherein each said groove extends a distance into said semiconductor material greater than the average width of each respective groove to substantially reduce the series resistance of the conducting material in each groove while reducing the area of inactive cell surface, and wherein the location and shape of said conducting material is defined by the location and shape of each said groove, and further wherein said conducting material is confined to and substantially fills each said groove, said conducting material being in intimate contact with the walls of each respective groove to reduce the contact resistance between said conducting material and said semiconductor material.

2. A solar cell as claimed in claim 1 wherein the ratio of the width to the depth of each said groove lies in the range of 1:2 to 1:7.

3. A solar cell as claimed in claim 1 wherein the transverse cross-section of said groove is U-shaped.

4. A solar cell as claimed in claim 1 wherein the transverse cross-section of said groove is V-shaped.

5. A solar cell as claimed in claim 1 wherein the pattern of the conducting material is determined by a plurality of said grooves formed in the surface of the cell prior to formation of the contacts.

* * * * *